(12) United States Patent
Wu et al.

(10) Patent No.: US 9,911,582 B2
(45) Date of Patent: *Mar. 6, 2018

(54) METHODS AND APPARATUS FOR CONTROLLING PHOTORESIST LINE WIDTH ROUGHNESS WITH ENHANCED ELECTRON SPIN CONTROL

(71) Applicant: Applied Materials, Inc., Santa Clara, CA (US)

(72) Inventors: Banqiu Wu, San Jose, CA (US); Ajay Kumar, Cupertino, CA (US); Kartik Ramaswamy, San Jose, CA (US); Omkaram Nalamasu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 66 days.

This patent is subject to a terminal disclaimer.

(21) Appl. No.: 14/939,787

(22) Filed: Nov. 12, 2015

(65) Prior Publication Data
US 2016/0064197 A1    Mar. 3, 2016

Related U.S. Application Data

(62) Division of application No. 13/455,753, filed on Apr. 25, 2012, now abandoned.
(Continued)

(51) Int. Cl.
*H01J 37/32* (2006.01)
*H01L 21/027* (2006.01)
*H01L 21/311* (2006.01)

(52) U.S. Cl.
CPC .. *H01J 37/32669* (2013.01); *H01J 37/32009* (2013.01); *H01J 37/3244* (2013.01);
(Continued)

(58) Field of Classification Search
CPC ........... H01J 37/32669; H01J 37/32009; H01J 37/32422; H01J 37/3244; H01L 21/0273; H01L 21/31144
See application file for complete search history.

(56) References Cited

U.S. PATENT DOCUMENTS 4,684,848 A    8/1987  Kaufman et al.
5,266,364 A    11/1993 Tamura et al.
(Continued)

OTHER PUBLICATIONS

PCT international search report and written opinion of PCT/US2012/034926 dated Oct. 31, 2012.

*Primary Examiner* — Duy Deo
(74) *Attorney, Agent, or Firm* — Patterson + Sheridan, LLP

(57) ABSTRACT

The present disclosure provides methods and an apparatus for controlling and modifying line width roughness (LWR) of a photoresist layer with enhanced electron spinning control. In one embodiment, an apparatus for controlling a line width roughness of a photoresist layer disposed on a substrate includes a processing chamber having a chamber body having a top wall, side wall and a bottom wall defining an interior processing region, a support pedestal disposed in the interior processing region of the processing chamber, and a plasma generator source disposed in the processing chamber operable to provide predominantly an electron beam source to the interior processing region.

8 Claims, 6 Drawing Sheets

Related U.S. Application Data

(60) Provisional application No. 61/497,370, filed on Jun. 15, 2011.

(52) U.S. Cl.
 CPC .... *H01J 37/32422* (2013.01); *H01L 21/0273* (2013.01); *H01L 21/31144* (2013.01)

(56) References Cited

U.S. PATENT DOCUMENTS

| | | |
|---|---|---|
| 5,462,629 A | 10/1995 | Kubota et al. |
| 5,531,834 A | 7/1996 | Ishizuka et al. |
| 6,291,940 B1 | 9/2001 | Scholte Van Mast |
| 8,709,706 B2 * | 4/2014 | Wu .................. G03F 7/36 430/313 |
| 2003/0148224 A1 * | 8/2003 | Vahedi ............. G03F 7/427 430/314 |
| 2005/0020070 A1 | 1/2005 | Ichiki et al. |
| 2005/0181630 A1 * | 8/2005 | Garza .............. H01L 21/0273 438/781 |
| 2005/0239291 A1 | 10/2005 | Alba et al. |
| 2007/0049048 A1 | 3/2007 | Rauf et al. |
| 2007/0068624 A1 | 3/2007 | Jeon et al. |
| 2008/0099426 A1 | 5/2008 | Kumar et al. |

* cited by examiner

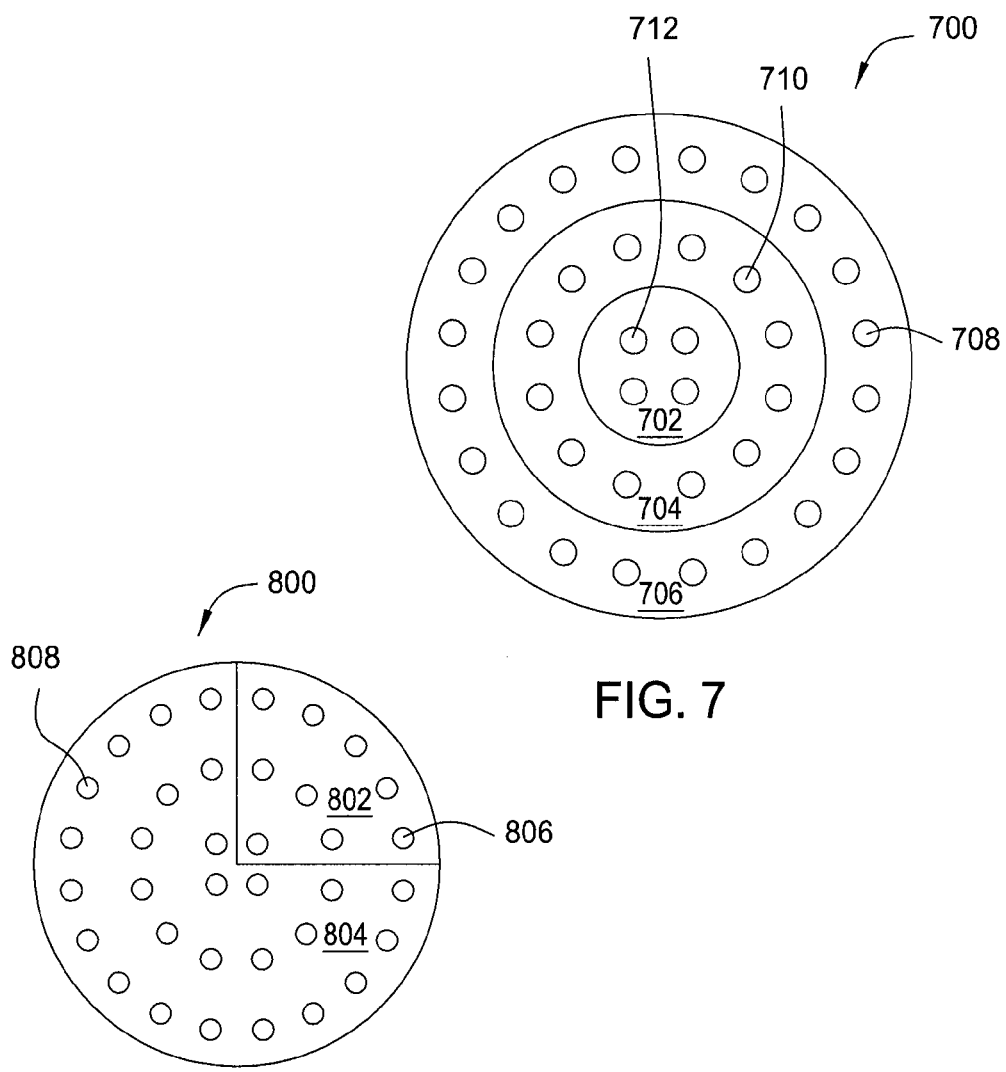
FIG. 7
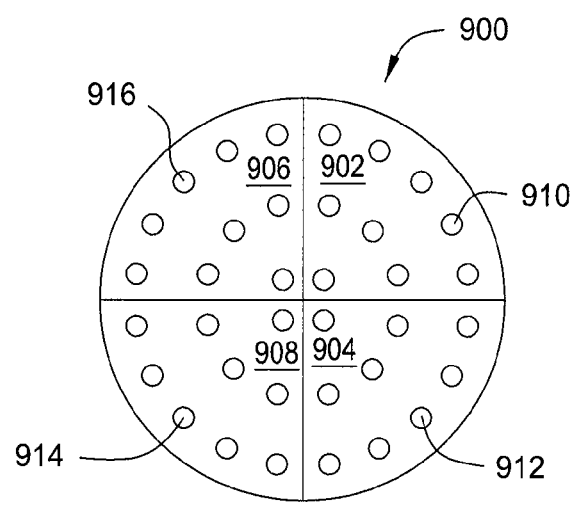
FIG. 8
FIG. 9

METHODS AND APPARATUS FOR CONTROLLING PHOTORESIST LINE WIDTH ROUGHNESS WITH ENHANCED ELECTRON SPIN CONTROL

CROSS-REFERENCE TO RELATED APPLICATIONS

This application is a divisional application of U.S. patent application Ser. No. 13/455,753, entitled "METHODS AND APPARATUS FOR CONTROLLING PHOTORESIST LINE WIDTH ROUGHNESS WITH ENHANCED ELECTRON SPIN CONTROL", filed Apr. 25, 2012, which claims benefit of U.S. Provisional Application Ser. No. 61/497,370 filed on Jun. 15, 2011, which are herein incorporated by references.

BACKGROUND

Field

The present disclosure generally relates to methods and apparatus for controlling photoresist line width roughness and, more specifically, to methods and apparatus for controlling photoresist line width roughness with enhanced electron spin control in semiconductor processing technologies.

Description

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g. to sub-micron dimensions), more elements are required to be put in a given area of a semiconductor integrated circuit. Accordingly, lithography process has become more and more challenging to transfer even smaller features onto a substrate precisely and accurately without damage. In order to transfer precise and accurate features onto a substrate, a desired high resolution lithography process requires having a suitable light source that may provide a radiation at a desired wavelength range for exposure. Furthermore, the lithography process requires transferring features onto a photoresist layer with minimum photoresist line width roughness (LWR). After all, a defect-free photomask is required to transfer desired features onto the photoresist layer. Recently, an extreme ultraviolet (EUV) radiation source has been utilized to provide short exposure wavelengths so as to provide a further reduced minimum printable size on a substrate. However, at such small dimensions, the roughness of the edges of a photoresist layer has become harder and harder to control.

FIG. 1 depicts an exemplary top isometric sectional view of a substrate 100 having a patterned photoresist layer 104 disposed on a target material 102 to be etched. Openings 106 are defined between the patterned photoresist layer 104 readily to expose the underlying target material 102 for etching to transfer features onto the target material 102. However, inaccurate control or low resolution of the lithography exposure process may cause in poor critical dimension control in the photoresist layer 104, thereby resulting in unacceptable line width roughness (LWR) 108. Large line width roughness (LWR) 108 of the photoresist layer 104 may result in inaccurate feature transfer to the target material 102, thus, eventually leading to device failure and yield loss.

Therefore, there is a need for a method and an apparatus to control and minimize line width roughness (LWR) so as to obtain a patterned photoresist layer with desired critical dimensions.

SUMMARY

The present disclosure provides methods and an apparatus for controlling and modifying line width roughness (LWR) of a photoresist layer with enhanced electron spin control. In one embodiment, an apparatus for controlling a line width roughness of a photoresist layer disposed on a substrate includes a processing chamber having a chamber body having a top wall, side wall and a bottom wall defining an interior processing region, a support pedestal disposed in the interior processing region of the processing chamber, and a plasma generator source disposed in the processing chamber operable to provide predominantly an electron beam source to the interior processing region.

In another embodiment, a method for controlling line width roughness of a photoresist layer disposed on a substrate includes providing a substrate having a patterned photoresist layer disposed thereon into a processing chamber, supplying a gas mixture into the processing chamber, generating an electron beam from the gas mixture having electrons moving in a circular mode from the gas mixture, generating a magnetic field to enhance spinning of electrons in the electron beam moving in the circular mode to a substrate surface, and trimming an edge profile of the patterned photoresist layer disposed on the substrate surface with the enhanced electrons.

In yet another embodiment, a method for controlling line width roughness of a photoresist layer disposed on a substrate includes supplying a gas mixture into a processing chamber having a substrate disposed therein, wherein the substrate has a patterned photoresist layer disposed thereon, generating an electron beam in the processing chamber from the gas mixture supplied in the processing chamber, applying a voltage to a shield plate disposed in the processing chamber to filter ions from the electron beam, directing the electron beam through a control plate, applying a DC or AC power to a group of one or more electromagnetic coils disposed around an outer circumference of the processing chamber to generate a magnetic field, enhancing movement of the electron beam in circular mode by passing through the filtered electron beam in the magnetic field and rotating the electron beam to trim an edge profile of the patterned photoresist layer using the electron beam.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

FIG. 7 depicts another embodiment of a control plate and/or a shield plate;

FIG. 8 depicts yet another embodiment of a control plate and/or a shield plate; and FIG. 9 depicts still another embodiment of a control plate and/or a shield plate.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Embodiments of the present disclosure include methods and apparatus for controlling line width roughness (LWR) of a photoresist layer disposed on a substrate. The line width roughness (LWR) of a photoresist layer may be controlled by performing an ICP plasma process with enhanced electron spin control on a photoresist layer after an exposure/development process. The ICP plasma process is performed to provide a chemical and electron grinding process in a nanometer scale with enhanced electron spin control to smooth the edge of the photoresist layer pattern with sufficient electron spin momentum, thereby providing a smooth pattern edge of the photoresist layer with minimum pattern edge roughness for subsequent etching processes. The ICP plasma process with enhanced electron spin control may also used to etch a target material disposed underneath the photoresist layer on the substrate subsequent to the photoresist line edge roughness minimization process.

Figure 1:
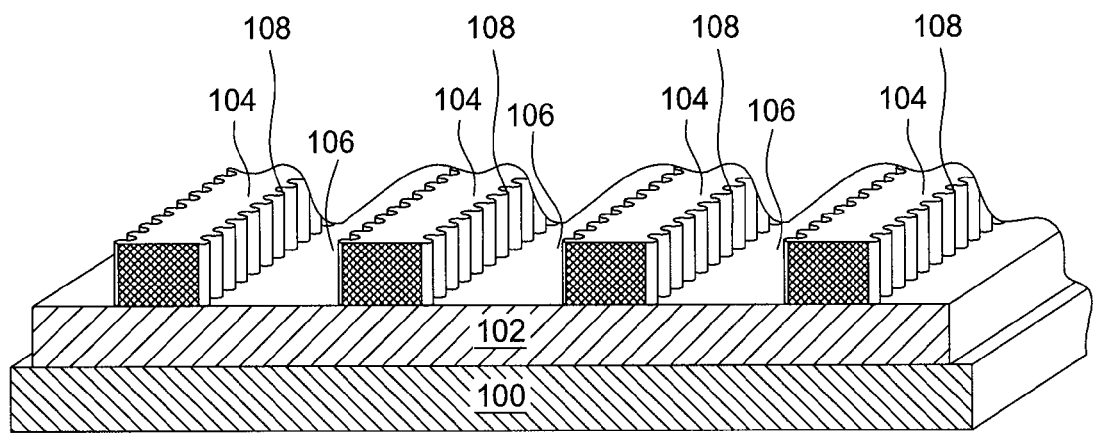
FIG. 1 depicts a top isometric sectional view of an exemplary structure of a patterned photoresist layer disposed on a substrate conventionally in the art.
Figure 2B:
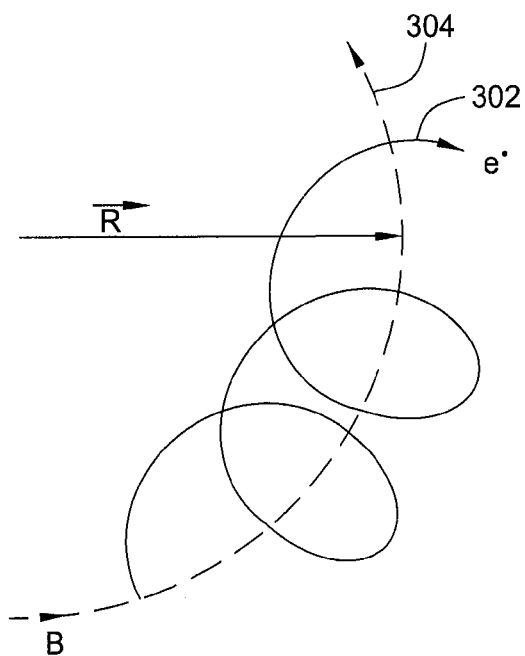
FIG. 2B depicts an electron trajectory diagram according to one embodiment of the disclosure.
Figure 2A:
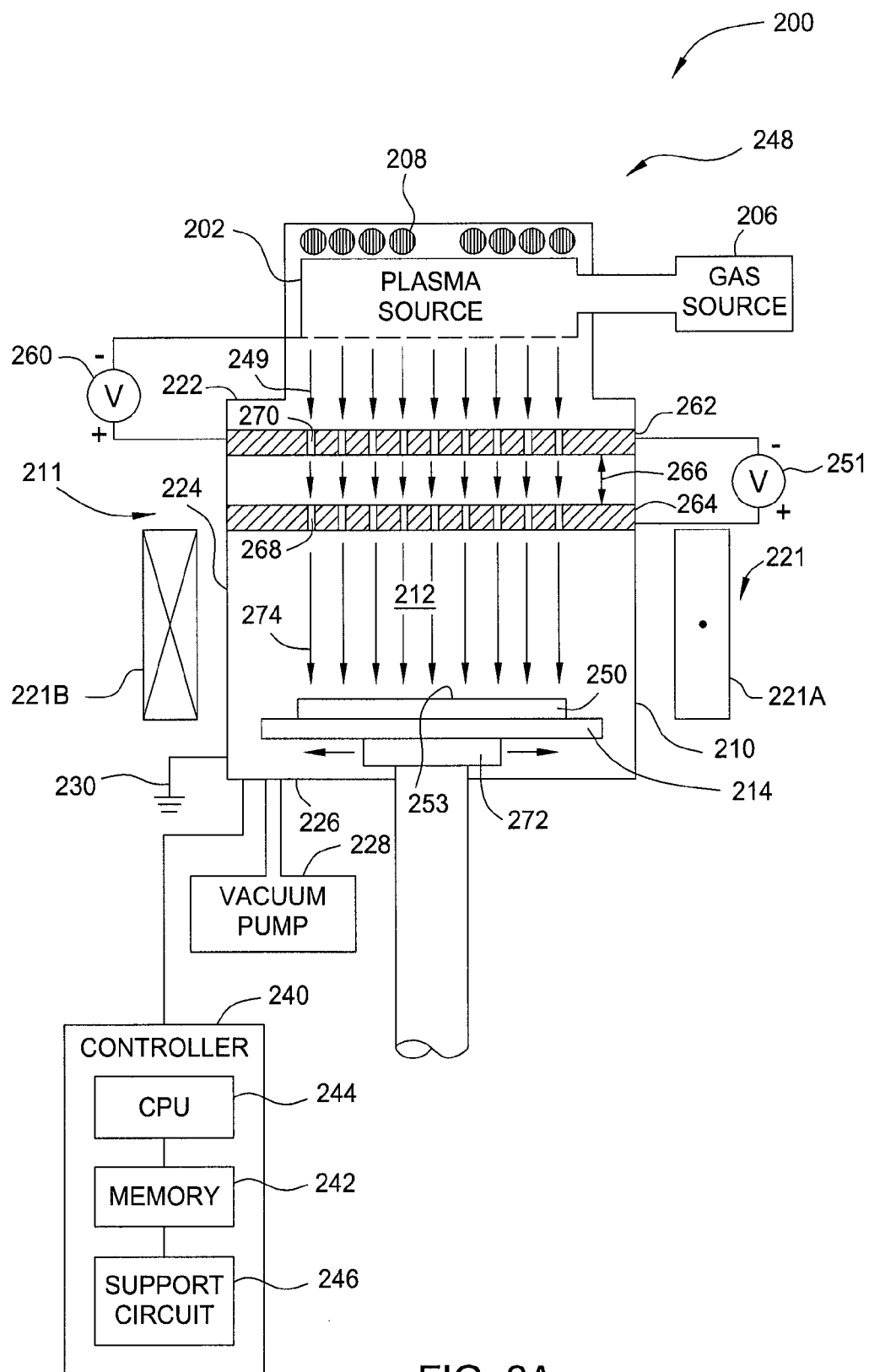
FIG. 2A depicts a schematic cross-sectional view of an inductively coupled plasma (ICP) reactor with enhanced electron spin control used according to one embodiment of the disclosure.

FIG. 2A depicts a schematic, cross-sectional diagram of one embodiment of an ICP plasma reactor 200 suitable for performing plasma process with enhanced electron spin control according to the present disclosure. One such etch reactor that may be adapted for performing the disclosure may be available from Applied Materials, Inc., of Santa Clara, Calif. It is contemplated that other suitable plasma process chamber may also be employed herein, including those from other manufacturers.

The plasma reactor 200 includes a processing chamber 248 having a chamber body 210. The processing chamber 248 is a high vacuum vessel having a vacuum pump 228 coupled thereto. The chamber body 210 of the processing chamber 248 includes a top wall 222, a sidewall 224 and a bottom wall 226 defining an interior processing region 212 therein. The temperature of the sidewall 224 is controlled using liquid-containing conduits (not shown) that are located in and/or around the sidewall 224. The bottom wall 226 is connected to an electrical ground 230.

The processing chamber 248 includes a support pedestal 214. The support pedestal 214 extends through the bottom wall 226 of the processing chamber 248 into the interior processing region 212. The support pedestal 214 may receive a substrate 250 to be disposed thereon for processing.

A plasma generator source 202 is attached to top of the chamber body 210 configured to supply electrons to the interior processing region 212. A plurality of coils 208 may be disposed around the plasma generator source 202 to insist creating inductively coupled plasma from the plasma generator source 202.

Processing gases may be introduced to the interior processing region 212 from a gas source 206 coupled to the processing chamber 248. The processing gases from the gas source 206 are supplied to the interior processing region 212 through the plasma generator source 202. Current is applied to the coil 208 from a power source which creates the electric field that dissociates the gas. The processing gases dissociated by the coils 208 forms an electron beam 249 to be delivered to the interior processing region 212 for processing.

A group of one or more coil segments or electromagnetic coils 221 (shown as 221A and 221B) are disposed around an outer circumference of a lower portion 211 of the chamber body 210 adjacent to the interior processing region 212. Power to the coil segment(s) or magnets 221 is controlled by a DC power source or a low-frequency AC power source (not shown). The electromagnetic coils 221 generate the magnetic field in a direction perpendicular to the substrate surface where the electron beam 249 is introduced into the processing chamber 248. As the electrons from the electron beam 249 may not have sufficient momentum to reach down to the interior processing region 212 further down to an upper surface 253 of the substrate 250, the group of the coil segments or electromagnetic coils 221 may be disposed at the lower portion of the chamber body 210 (e.g., close to the interior processing region 212) to enhance spinning and/or whirling of the electrons down to the upper surface 253 of the substrate 250. The interaction between the electric field and magnetic field generated from the group of the coil segments or electromagnetic coils 221 causes the electron beam 249 having enhanced electron spinning and/or whirling momentum to down to the surface of the substrate 250. It is noted that other magnetic field source capable of generating sufficient magnetic field strength to promote electron beam (e-beam) source may also be used.

In one embodiment, a shield plate 262 is disposed in the processing chamber 248 above the support pedestal 214. The shield plate 262 is a substantially flat plate comprising a plurality of apertures 270. The shield plate 262 may be made of a variety of materials compatible with process needs, comprising one or more apertures 270 that define desired open areas in the shield plate 262. In one embodiment, the shield plate 262 may be fabricated from a material selected from a group consisting of copper or copper coated ceramics. The open areas of the shield plate 262 (i.e., the size and density of the apertures 270) assist in controlling the amount of ions/electrons which mainly consist of electron beam and small amount of ions formed from the plasma generator source 202 to the interior processing region 212 above the upper surface 253 of the substrate 250. Accordingly, the shield plate 262 acts as an ion/electron filter (or electron controller) that controls the electron density and/or ion density in volume passing through the shield plate 262 to the upper surface 253 of the substrate 250.

During processing, a voltage from a power source 260 may be applied to the shield plate 262. The voltage potential applied on the shield plate 262 may attract ions from the plasma, thereby efficiently filtering the ions from the plasma, while allowing only neutral species, such as radicals and electrons, to pass through the apertures 270 of the shield plate 262. Thus, by reducing/filtering the amount of ions through the shield plate 262, grinding or smoothing of the structures formed on the substrate by neutral species, radicals, or electrons, i.e., mild reactive species, can be processed in a more controlled manner. Therefore, the mild reactive species may reduce likelihood of undesired erosion sputter, or overly aggressive ion bombardment that may cause to the substrate surface, thereby resulting in precise smoothing performance and critical dimension uniformity. The voltage applied to the shield plate 262 may be supplied at a range sufficient to attract or retain ions from the plasma, thereby repelling the neutral species, radicals, or electrons from the ions generated in the plasma. Thus, the mild reactive species are extracted from the plasma by the shield plate 262. In one embodiment, the voltage is applied to the shield plate 262 from the power source 260 between about 50 Volts DC and about 200 Volts DC. In another embodiment, the mild reactive species are extracted from the plasma by the shield plate 262 are predominantly electrons.

A control plate 264 is disposed below the shield plate 262 and above the support pedestal 214. The control plate 264 has a plurality of apertures 268 that allows the neutral species, radicals, or electrons filtered through the shield plate 262 to pass therethrough into the interior processing region 212. The control plate 264 is positioned in a spaced-apart relationship with the shield plate 262 at a predetermined distance 266. In another embodiment, the control plate 264 is to attach to the shield plate 262 with minimum space in between. In one embodiment, the distance 266 between the shield plate 262 and the control plate 264 is less than about 20 mm.

A voltage from a power source 251 may be applied to the control plate 264, so as to create a voltage potential (e.g., an electrical potential) that interacts with the magnetic field generated from the group of the coil segments or electromagnetic coils 221 (shown as 221A and 221B). The electrical potential generated by the control plate 264 along with the magnetic field generated by the group of the coil segments or electromagnetic coils 221 assist and enhance maintaining sufficient momentum and energy to keep the neutral species, radicals, or electrons spinning down to the upper surface 253 of the substrate 250. Furthermore, the neutral species, radicals, or electrons passing through the apertures 268 of the control plate 264 may be directed in a predetermined path, thereby confining the trajectory of the neutral species, radicals, or electrons in a predetermined path to reach to a desired area on the upper surface 253 of the substrate 250. When passing through the control plate 264, the magnified field may cause the neutral species, radicals, or electrons passing through to keep moving in a circular mode and spinning toward to the upper surface 253 of the substrate 250. The spin electrons have to grid the structures with sufficient momentum to bottoms of the structures formed on the upper surface 253 of the substrate 250.

In one embodiment, the control plate 264 may have different materials or different characteristics. The control plate 264 may comprise more than one zone or segments having at least one characteristic that is different from each other. For example, the control plate 264 may have a number of zones with different configurations including various geometries (e.g., sizes, shapes and open areas) and the zones may be made of the same or different materials, or be adapted to have different potential bias or different powers. By providing combinations of zone configurations, materials, powers, and/or potential bias, the spatial distribution of the neutral species, radicals, and electrons in the plasma may be modified in a localized manner, allowing customization of process characteristics, such as smoothing uniformity or locally enhanced or reduced smoothing rates (e.g., to tailor to different pattern densities in different parts of a substrate) and so on. Such multi-zone control plate 264 maybe sued to active control of the neutral species, radicals, and electrons distribution, and thus, allow for enhanced process control. More embodiment of the control plate 264 will be further discussed above with referenced to FIGS. 7-9.

During substrate processing, gas pressure within the interior of the processing chamber 248 may be controlled in a predetermined range. In one embodiment, the gas pressure within the interior processing region 212 of the processing chamber 248 is maintained at about 0.1 to 999 mTorr. The substrate 250 may be maintained at a temperature of between about 10 to about 500 degrees Celsius.

Furthermore, the processing chamber 248 may include a translation mechanism 272 configured to translate the support pedestal 214 and the control plate 264 relative to one another. In one embodiment, the translation mechanism 272 is coupled to the support pedestal 214 to move the support pedestal 214 laterally relative to the control plate 264. In another embodiment, the translation mechanism 272 is coupled to the plasma generator source 202 plasma generator source 202 and/or the control plate 264 and/or the shield plate 262 to move the plasma generator source 202 plasma generator source 202 and/or the control plate 264 and/or the shield plate 262 laterally relative to the support pedestal 214. In yet another embodiment, the translation mechanism 272 moves one or more of plasma generator source 202, the control plate 264 and shield plate 262 laterally relative to the support pedestal 214. Any suitable translation mechanism may be used, such as a conveyor system, rack and pinion system, an x/y actuator, a robot, electronic motors, pneumatic actuators, hydraulic actuators, or other suitable mechanism.

The translation mechanism 272 may be coupled to a controller 240 to control the scan speed at which the support pedestal 214 and plasma generator source 202 and/or the control plate 264 and/or the shield plate 262 move relative to one another. In addition, translation of the support pedestal 214 and the plasma generator source 202 and/or the control plate 264 and/or the shield plate 262 relative to one another may be configured to be along a path perpendicular to the predetermined trajectory 274 of the neutral species, radicals, or electrons the upper surface 253 of the substrate 250. In one embodiment, the translation mechanism 272 moves at a constant speed, of approximately 2 millimeters per seconds (mm/s). In another embodiment, the translation of the support pedestal 214 and the plasma generator source 202 and/or the control plate 264 and/or the shield plate 262 relative to one another may be moved along other paths as desired.

The controller 240, including a central processing unit (CPU) 244, a memory 242, and support circuits 246, is coupled to the various components of the reactor 200 to facilitate control of the processes of the present disclosure. The memory 242 can be any computer-readable medium, such as random access memory (RAM), read only memory (ROM), floppy disk, hard disk, or any other form of digital storage, local or remote to the reactor 200 or CPU 244. The support circuits 246 are coupled to the CPU 244 for supporting the CPU 244 in a conventional manner. These circuits include cache, power supplies, clock circuits, input/output circuitry and subsystems, and the like. A software routine or a series of program instructions stored in the memory 242, when executed by the CPU 244, causes the reactor 200 to perform a plasma process of the present disclosure.

FIG. 2A only shows one exemplary configuration of a plasma reactor that can be used to practice the disclosure. For example, other types of reactors may utilize different types of plasma power and magnetic power coupled into the plasma chamber using different coupling mechanisms. In some applications, different types of plasma may be generated in a different chamber from the one in which the substrate is located, e.g., remote plasma source, and the plasma subsequently guided into the chamber using techniques known in the art.

Figure 3:
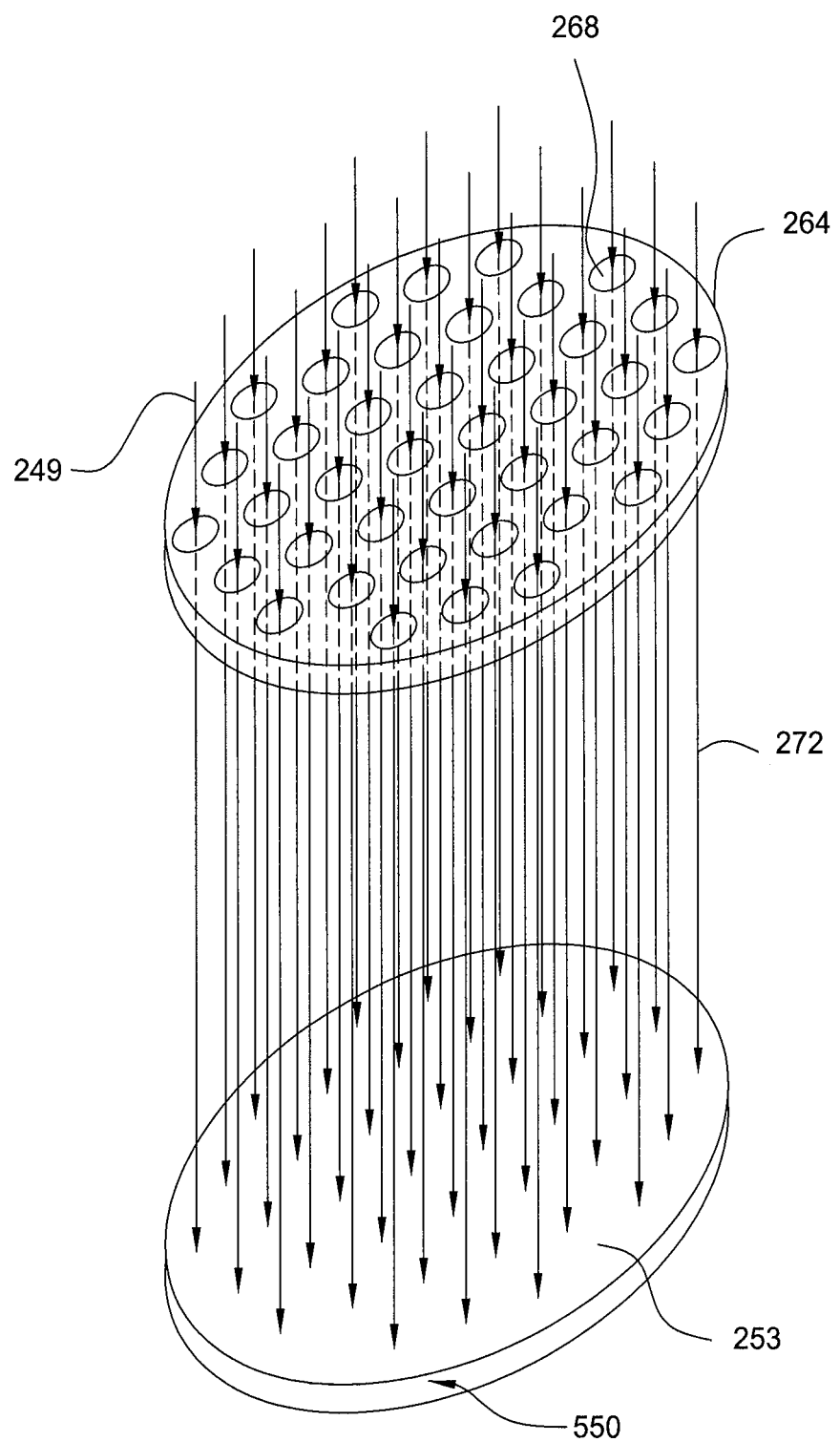
FIG. 3 depicts an electron trajectory diagram passing through a beam control plate disposed in the ICP plasma reactor depicted in FIG. 2.

FIG. 3 depicts an electron trajectory diagram passing through the control plate 264 depicted in FIG. 2 according to one embodiment of the disclosure. As the filtered neutral species, radicals, and electrons (e.g., electron beam source) passing through the shield plate 262 are accelerated toward the upper surface 253 of the substrate 250, the filtered neutral species, radicals, and electrons (e.g., electron beam source) subsequently passing through the control plate 264 may be confined to pass through the apertures 268 formed in the control plate 264. As the group of electromagnetic coils 221 are disposed around the control plate 264, the neutral species, radicals, and electrons (e.g., electron beam source) passing therethough may keep orbiting around and travelling down in the predetermined trajectory 274 confined by the apertures 268 of the control plate 264 and reach to desired regions on the upper surface 253 of the substrate 250. By utilization of the control plate 264, the trajectory 274 of the neutral species, radicals, and electrons (e.g., electron beam source) may be efficiently controlled in a manner with enhanced electron spinning momentum so as to enable electrons to travel deep down to the bottom of the structures formed on the substrate while continuing to spin around the horizontal plane so that the electrons grind and smooth the roughness from the edge of the structures formed on the substrate 250.

Figure 4:
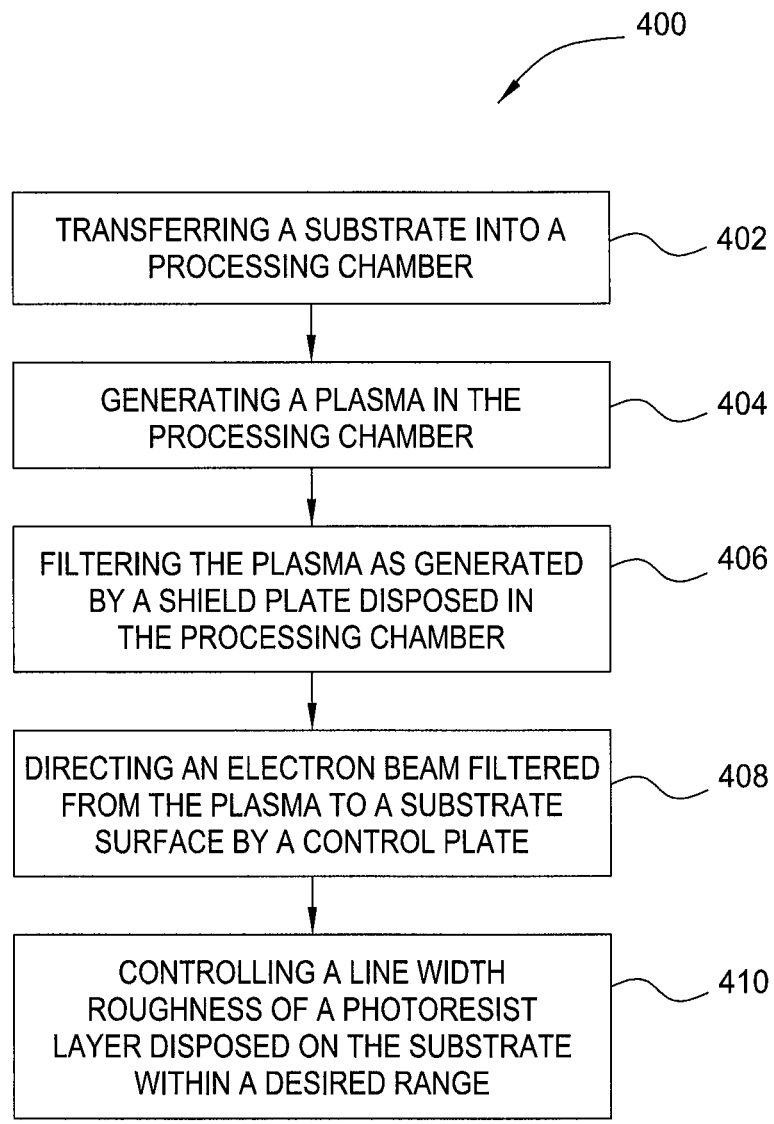
FIG. 4 depicts a flow diagram of one embodiment of performing a photoresist line width roughness control process according to one embodiment of the present disclosure.

FIG. 4 illustrates a flow diagram of one embodiment of performing a photoresist line width roughness (LWR) control process 400 according to one embodiment of the disclosure. The process 400 may be stored in memory 242 as instructions that executed by the controller 240 to cause the process 400 to be performed in an ICP plasma processing chamber, such as the ICP plasma reactor 200 depicted in FIG. 2A or other suitable reactors.

Figure 6:
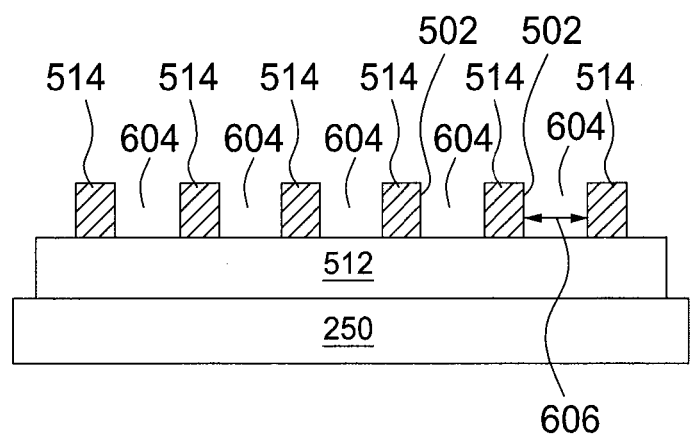
FIG. 6 depicts a profile of a line width roughness of a photoresist layer disposed on a substrate according to one embodiment of the disclosure.

The process 400 begins at a block 402 by transferring a substrate, such as the substrate 250 depicted in FIG. 2A, into the processing chamber 248 for processing. The substrate 250 may have a target material 512 to be etched disposed thereon, as shown in FIG. 6, disposed under a photoresist layer 514. In one embodiment, the target material 512 to be etched using the photoresist line width roughness (LWR) control process 400 may be a dielectric layer, a metal layer, a ceramic material, or other suitable material. In one embodiment, the target material 512 to be etched may be a dielectric material formed as a gate structure or a contact structure or an inter-layer dielectric structure (ILD) utilized in semiconductor manufacture. Suitable examples of the dielectric material include $SiO_2$, SiON, SiN, SiC, SiOC, SiOCN, amorphous-carbon (a-C), or the like. In another embodiment, the target material 512 to be etched may be a metal material formed as an inter-metal dielectric structure (IMD) or other suitable structures. Suitable examples of metal layers include Cu, Al, W, Ni, Cr, or the like.

Figure 5:
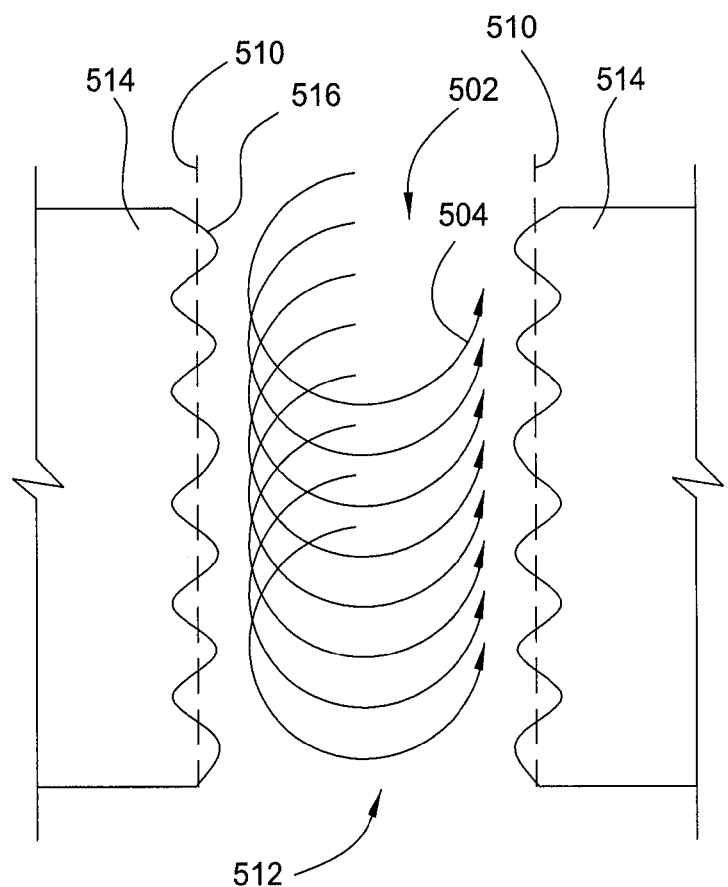
FIG. 5 depicts a top view of electron trajectories traveled adjacent to a photoresist layer according to one embodiment of the present disclosure.

At block 404, a photoresist line width roughness (LWR) control process 400 may be performed on the substrate 250 to grind, modify and trim edges 516 of the photoresist layer 514, as shown in FIG. 5. The photoresist line width roughness (LWR) control process 400 is performed providing a source of electrons. In one embodiment, the electrons are providing by generating an ICP plasma in the processing chamber 248. The ICP plasma is generated by the plasma generator source 202 disposed in the processing chamber 248. As discussed above, the plasma as generated may include different types of reactive species, such as electrons, charges, ions, neutral species, and so on either with positive or negative charges. The excited plasma is used to extract electrons which are moved and accelerated in a circular motion toward the upper surface 253 of the substrate 250.

At block 406, as the plasma is advanced toward the substrate surface, the plasma then passes through the shield plate 262 disposed in the processing chamber 248. A voltage is applied to the shield plate 262 to create a voltage potential, so as to attract ions from the plasma, thereby efficiently filtering ions from the plasma, while allowing only neutral species, such as radicals and electrons (e.g., electron beam source), to pass through the apertures 270 of the shield plate 262 to the substrate surface. In one embodiment, the voltage is applied to the shield plate 262 from power source 260 between about 50 Volts DC and about 200 Volts DC.

At block 408, after passing through the shield plate 262, the filtered plasma (e.g., electron beam source) then travels through the control plate 264. The control plate 264 may confine the filtered plasma passing therethrough to a predetermined path so as to increase collimation of the filtered plasma (e.g., electron beam source) such that the mild reactive species fall on certain regions of the upper surface 253 of the substrate 250. The filtered plasma (e.g., electron beam source) is accelerated to maintain a substantially helical movement circulates by the magnetic field generated from the group of the electromagnetic coils 221 such that the mild reactive species have sufficient momentum to maintain a spinning motion down to the upper surface 253 of the substrate 250. A power supplied to the control plate 264 may generate an electric field to interact with the magnetic field generated from the group of the electromagnetic coils 221 to enhance/maintain the helical motion of the mild reactive species such that sufficient momentum and energy is provided to keep the mild reactive species spinning down to the upper surface 253 of the substrate 250. The spin electrons may, thus, grind the structures with sufficient momentum all the way to bottoms of the structures formed on the upper surface 253 of the substrate 250.

At block 410, the line width roughness (LWR) of the photoresist layer 514 may be adjusted, grinded, modified, controlled during the plasma-induced process. As depicted in FIG. 5, the circular movement 504 of the electrons may smoothly grind, collide, and polish away the uneven edges 516 of the photoresist layer 514. The process may be continuously performed until a desired degree of roughness, e.g., straightness, (as shown by imaginary line 510) of photoresist layer 514 is achieved. By a good control of the electron momentum, the uneven surfaces and protrusions from edges 516 of the photoresist layer 514 may be gradually flattened out, thereby efficiently controlling the photoresist line width roughness (LWR) within a desired minimum range. The electron momentum or neutral species concentration may be controlled by the power generated from the interaction between the magnetic field and the electric field and the gases supplied thereto. In one embodiment, by adjusting the power supplied to generate the plasma power and the magnetic field, different electron momentum or mobility may be obtained.

In one embodiment, the distribution of the electrons and/or neutral species (e.g., electron beam source) may be controlled by using different control plate 264 with different materials or different characteristics. More embodiment of the control plate 264 with different materials or different characteristics will be further discussed above with referenced to FIGS. 7-9.

During processing, at block 410, several process parameters may be controlled to maintain the line width roughness of the photoresist layer 514 at a desired range. In one embodiment, the plasma power may be supplied to the processing chamber between about 50 Watt and about 2000 Watt. The magnetic field generated in first group of coils or magnetic segments 208 in the processing chamber may be controlled between about 500 Gauss (G) and about 1000 G. A DC and/or AC power between about 100 watts and about 2000 watt may be used to generate a magnetic field in the processing chamber. The magnetic field generated in group of electromagnetic coils 221 in the processing chamber may be controlled between about 100 G and about 200 G. A DC and/or AC power may be applied to the control plate 264 between about 100 Watt and about 2000 Watt may be used to generate magnetic field in the processing chamber. The voltage between about 50 Volts DC and about 200 Volts DC is applied to the shield plate 262 to filter the plasma as generated from the plasma generator 202. The pressure of the processing chamber may be controlled at between about 0.5 milliTorr and about 500 milliTorr. A processing gas may be supplied into the processing chamber to assist modifying, trimming, and controlling the edge roughness of the photoresist layer 514. As the materials selected for the photoresist layer 514 are often organic materials, an oxygen containing gas may be selected as the processing gas to be supplied into the processing chamber to assist gridding and modifying the roughness and profile of the photoresist layer 514. Suitable examples of the oxygen containing gas include $O_2$, $N_2O$, $NO_2$, $O_3$, $H_2O$, CO, $CO_2$, and the like. Other types of processing gas may also be supplied into the processing chamber, simultaneously or individually, to assist modifying the roughness of the photoresist layer 514. Suitable examples of the processing gas include $N_2$, $NH_3$, $Cl_2$ or inert gas, such as Ar or He. The processing gas may be supplied into the processing chamber at a flow rate between about 10 sccm to about 500 sccm, for example, about between about 100 sccm to about 200 sccm. The process may be performed between about 30 second and about 200 second. In one particular embodiment, the $O_2$ gas is supplied as the processing gas into the processing chamber to react with the photoresist layer 514 so as to trim and modify the line width roughness (LWR) of the photoresist layer 514 disposed on the substrate 250.

The photoresist line width roughness (LWR) control process 400 may be continuously performed until a desired minimum roughness of the photoresist layer 514 is achieved. In one embodiment, line width roughness 513 of the photoresist layer 514 may be controlled in a range less than about 3.0 nm, such as between about 1.0 nm and about 1.5 nm. The photoresist line width roughness (LWR) control process 400 may be terminated after reaching an endpoint signaling indicating a desired roughness of the photoresist layer 514 is achieved. Alternatively, the photoresist line width roughness (LWR) control process 400 may be terminated by a preset time mode. In one embodiment, the photoresist line width roughness (LWR) control process 400 may be performed for between about 100 seconds and between about 500 seconds.

FIG. 6 depicts an exemplary embodiment of a cross sectional view of the photoresist layer 514 already having the photoresist line width roughness (LWR) control process 400 performed thereon. After the photoresist line width roughness (LWR) control process 400, a smooth edge surface is obtained. The roughness of the photoresist layer 514 is smoothed out and trimmed in a manner to minimize the edge roughness and smooth the edge morphology of the photoresist layer 514. The smooth edge surface formed in the photoresist layer 514 defines a sharp and well defined opening 604 in the patterned photoresist layer 514 to expose the underlying target material 512 for etching, thereby etching a precise and straight opening width 606 to be formed as a mask layer. In one embodiment, the width 606 of the openings 604 may be controlled between about 15 nm and about 35 nm.

In one embodiment, the underlying target material 512 may be etched by an etching process performed in the same chamber used to perform the line width roughness (LWR) control process, such as the processing chamber 248 depicted in FIG. 2. In another embodiment, the underlying target material 512 may be etched by an etching process performed in any other different suitable etching chamber integrated in a cluster system where the line width roughness (LWR) process chamber may be incorporated thereto. In yet another embodiment, the underlying target material 512 may be etched by an etching process performed in any other different suitable etching chamber, including stand-alone chamber separated from the line width roughness (LWR) process chamber or separated from a cluster system where the line width roughness (LWR) process chamber may be incorporated thereto.

In one embodiment, the gas mixture utilized to perform the line width roughness (LWR) process is configured to be different from the gas mixture utilized to etch the underlying target material 512. In one embodiment, the gas mixture utilized to perform the line width roughness (LWR) process includes an oxygen containing gas, such as $O_2$, and the gas mixture utilized to etch the underlying target material 512 includes a halogen containing gas, such as fluorine carbon gas, chlorine containing gas, bromide containing gas, fluorine containing gas, and the like.

FIG. 7 depicts one embodiment of a plate 700 having different zones in various arrangements. In the embodiment depicted in FIG. 7, the plate 700 has different zones, 702, 704, 706 arranged in concentric rings. The plate 700 may be used as one or both of a control plate or shield plate in the embodiment of FIG. 2A. The concentric ring configuration, for example, may be useful in compensating for plasma non-uniformities (in a radial direction) that may arise from non-uniform gas flow patterns in the chamber.

FIG. 8 depicts another embodiment of a plate 800 having different zones in various arrangements. The plate 800 may be used as one or both of a control plate or shield plate in the embodiment of FIG. 2A. In the embodiment depicted in FIG. 8, the plate 800 is configured to have zones or segments based on the specific mask patterns in order to achieve different smoothing rate resulted on the substrate surface. The plate 800 is divided into two zones 802, 804, whose spatial configurations correspond to or correlate with respective regions on a mask having different pattern densities. For example, if zone 802 corresponds to a region on the mask requiring a relatively high smoothing rate than the rest of the mask, zone 802 may be provided with larger diameter of apertures 806. Alternatively, zones 802, 804 may be made of materials with different dielectric contacts and/or different potential biases, so as to provide different electron (and/or neutral species) spinning or rotating rate may be contained.

FIG. 9 depicts yet another embodiment of a plate 900 having different zones in various arrangements. The plate 800 may be used as one or both of a control plate or shield plate in the embodiment of FIG. 2A. In the embodiment depicted in FIG. 9, the plate 900 is configured to have a plurality of zones or segments 902, 904, 906, 908. At least two zones are made of different materials compatible with process chemistries. At least two zones may be independently biased to maintain a potential difference between the biased zones. The use of materials having different dielectric constants or different potential bias allows users to tune the plasma characteristics or different rotating speed and momentum. Additionally, the sizes of apertures 910, 912, 914, 916 located in different zones 902, 904, 906, 908 of the plate 900 may be arranged in any combinations or configurations.

Thus, the present disclosure provides methods and an apparatus for controlling and modifying line width roughness (LWR) of a photoresist layer with enhanced electron spinning momentum. The method and apparatus can advantageously control, modify and trim the profile, line width roughness and dimension of the photoresist layer disposed on a substrate after a light exposure process, thereby providing accurate critical dimension control of an opening in the photoresist layer so the subsequent etching process may have accurately transfer critical dimensions to the underlying layer being etched through the opening.

While the foregoing is directed to embodiments of the present disclosure, other and further embodiments of the disclosure may be devised without departing from the basic scope thereof, and the scope thereof is determined by the claims that follow.

What is claimed is:

1. A method for controlling line width roughness of a photoresist layer disposed on a substrate comprising:
    providing a substrate having a patterned photoresist layer disposed thereon into a processing chamber;
    supplying a gas mixture into the processing chamber;
    generating an electron beam from the gas mixture having electrons moving in a circular mode from the gas mixture;
    generating a magnetic field to enhance spinning of electrons in the electron beam moving in the circular mode to a substrate surface;
    filtering ions from the electron beam by passing the ions through a plate, wherein the plate has at least two zones having different dielectric constants or different potential bias; and
    trimming an edge profile of the patterned photoresist layer disposed on the substrate surface with the enhanced electrons.

2. The method of claim 1, further comprising:
    directing the filtered electrons through the magnetic field.

3. The method of claim 1, wherein generating the magnetic field further comprising:
    applying a DC or AC power to one or more electromagnetic coils disposed around an outer circumference of the processing chamber.

4. The method of claim 1, wherein the gas mixture comprises an oxygen containing gas.

5. A method for controlling line width roughness of a photoresist layer disposed on a substrate comprising:
    supplying a gas mixture into a processing chamber having a substrate disposed therein, wherein the substrate has a patterned photoresist layer disposed thereon;
    generating an electron beam in the processing chamber from the gas mixture supplied in the processing chamber;
    applying a voltage to a shield plate disposed in the processing chamber to filter ions from the electron beam;
    directing the electron beam through a control plate;
    filtering ions from the electron beam by gassing the ions through the control plate, wherein the control plate has at least two zones having different dielectric constants or different potential bias;
    applying a DC or AC power to a group of one or more electromagnetic coils disposed around an outer circumference of the processing chamber to generate a magnetic field;
    enhancing movement of the electron beam in circular mode by passing through the filtered electron beam in the magnetic field; and
    rotating the electron beam to trim an edge profile of the patterned photoresist layer using the electron beam.

6. The method of claim 5, wherein directing the electron beam further comprises:
    applying a power to the control plate.

7. The method of claim 5, wherein supplying the gas mixture further comprises:
    supplying an oxygen containing gas into the processing chamber.

8. The method of claim 5, wherein the filtered electron beam include neutral radicals and electrons.

* * * * *